(12) United States Patent
Ahn et al.

(10) Patent No.: US 10,872,828 B2
(45) Date of Patent: Dec. 22, 2020

(54) INSPECTION AND REPLACEMENT METHOD FOR MICRO LED

(71) Applicant: POINT ENGINEERING CO., LTD., Asan (KR)

(72) Inventors: Bum Mo Ahn, Suwon (KR); Seung Ho Park, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/369,802

(22) Filed: Mar. 29, 2019

(65) Prior Publication Data
US 2019/0304854 A1 Oct. 3, 2019

(30) Foreign Application Priority Data
Mar. 29, 2018 (KR) .......................... 10-2018-0036867

(51) Int. Cl.
| | |
|---|---|
| *H01L 21/66* | (2006.01) |
| *H01L 25/075* | (2006.01) |
| *H01L 33/48* | (2010.01) |
| *H01L 33/00* | (2010.01) |

(52) U.S. Cl.
CPC .............. *H01L 22/22* (2013.01); *H01L 22/10* (2013.01); *H01L 22/12* (2013.01); *H01L 22/14* (2013.01); *H01L 22/20* (2013.01); *H01L 25/0753* (2013.01); *H01L 33/005* (2013.01); *H01L 33/48* (2013.01); *H01L 33/486* (2013.01)

(58) Field of Classification Search
CPC ......... H01L 22/10; H01L 22/12; H01L 22/14; H01L 22/20; H01L 22/22; H01L 33/005; H01L 33/48; H01L 33/486; H01L 27/156
See application file for complete search history.

(56) References Cited

U.S. PATENT DOCUMENTS

| | | | | |
|---|---|---|---|---|
| 2002/0096994 | A1* | 7/2002 | Iwafuchi | ............. H01L 33/0079 313/495 |
| 2017/0140961 | A1* | 5/2017 | Sasaki | ................. H01L 33/0095 |
| 2018/0233536 | A1* | 8/2018 | Chang | .................. H01L 27/156 |

FOREIGN PATENT DOCUMENTS

KR 100731673 B1 6/2007

\* cited by examiner

*Primary Examiner* — Eduardo A Rodela

(57) ABSTRACT

The present invention relates to an inspection and replacement method for a micro LED, the method being configured to inspect whether the micro LED is defective and replace a defective micro LED with a normal micro LED. More particularly, the present invention relates to an inspection and replacement method for a micro LED in which when micro LEDs are transferred to a display substrate, the micro LEDs are inspected so as to detect and remove a defective micro LED, and a normal micro LED is placed at a position where the defective micro LED is removed so as to be replaced with the defective micro LED.

3 Claims, 5 Drawing Sheets

INSPECTION AND REPLACEMENT METHOD FOR MICRO LED

CROSS REFERENCE TO RELATED APPLICATION

The present application claims priority to Korean Patent Application No. 10-2018-0036867, filed Mar. 29, 2018, the entire contents of which is incorporated herein for all purposes by this reference.

BACKGROUND OF THE INVENTION

Field of the Invention

The present invention relates to an inspection and replacement method for a micro LED, the method being configured to inspect whether the micro LED is defective and replace a defective micro LED with a normal micro LED.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next generation display. Liquid crystal and organic materials are the core materials of LCDs and OLEDs, respectively, whereas the micro LED display uses 1 μm to 100 μm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673) disclosed by Cree Inc., related research papers based thereon were subsequently published. In order to apply the micro LED to a display, it is necessary to develop a customized microchip based on a flexible material and/or flexible device using a micro LED device, and techniques of transferring the micrometer-sized LED chip and mounting the LED chip on a display pixel electrode are required.

With regard to the transfer of the micro LED device to the display substrate, as the LED size is reduced to 1 μm to 100 μm, it is impossible to use a conventional pick-and-place machine, and a technology of a transfer head for higher precision has been developed.

In particular, along with the micro LED transfer technology as described above, there has been a need to develop a method for detecting a defective micro LED that may occur during the transfer of micro LEDs and for replacing the same with a normal micro LED.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent No. 10-0731673

SUMMARY OF THE INVENTION

Accordingly, the present invention has been made keeping in mind the above problems occurring in the related art, and an objective of the present invention is to provide an inspection and replacement method for a micro LED in which when micro LEDs are transferred to a display substrate, the micro LEDs are inspected so as to detect and remove a defective micro LED, and a normal micro LED is placed at a position where the defective micro LED is removed so as to be replaced with the defective micro LED.

In order to achieve the above objective, according to one aspect of the present invention, there is provided an inspection and replacement method for a micro LED, the method including: temporarily attaching micro LEDs to a temporary substrate; inspecting whether the micro LEDs attached to the temporary substrate are defective; removing a defective micro LED, which is detected in the inspecting whether the micro LEDs attached to the temporary substrate are defective, from the temporary substrate; temporarily attaching a normal micro LED to the temporary substrate at a position where the defective micro LED is removed; and transferring all the micro LEDs temporarily attached to the temporary substrate to a display substrate.

According to another aspect of the present invention, there is provided an inspection and replacement method for a micro LED, the method including: gripping micro LEDs on a transfer head; inspecting whether the micro LEDs gripped on the transfer head are defective; removing a defective micro LED, which is detected in the inspecting whether the micro LEDs gripped on the transfer head are defective, from the transfer head; gripping a normal micro LED on the transfer head at a position where the defective micro LED is removed; and transferring all the micro LEDs gripped on the transfer head to a display substrate.

According to still another aspect of the present invention, there is provided an inspection and replacement method for a micro LED, the method including: gripping micro LEDs on a transfer head; inspecting whether the micro LEDs gripped on the transfer head are defective; removing a defective micro LED, which is detected in the inspecting whether the micro LEDs gripped on the transfer head are defective, from the transfer head; transferring all the micro LEDs gripped on the transfer head to a display substrate; and attaching a normal micro LED to the display substrate at a position where the defective micro LED is removed.

According to still another aspect of the present invention, there is provided an inspection and replacement method for a micro LED, the method including: gripping micro LEDs on a transfer head; inspecting whether the micro LEDs gripped on the transfer head are defective; transferring all the micro LEDs gripped on the transfer head to a display substrate; removing a defective micro LED, which is detected in the inspecting whether the micro LEDs gripped on the transfer head are defective, from the display substrate; and attaching a normal micro LED to the display substrate at a position where the defective micro LED is removed.

As described above, an inspection and replacement method for a micro LED according to the present invention has the following effects.

When the inspecting step, the removing step, and the replacing step are performed at the temporary substrate, it is ensured that only normal micro LEDs are transferred to the display substrate. This makes it possible to effectively prevent the occurrence of defective pixels on a display, which may be caused by defective micro LEDs.

Furthermore, in the case where the micro LEDs 10 are inspected for defects through the removing step before being transferred to the display substrate, it is not necessary to perform a separate inspection at the display substrate. This makes it possible to provide an increase in transfer process efficiency.

Furthermore, in the case where the replacing step is performed at the temporary substrate, it is possible for the transfer head to simultaneously transfer the normal micro LEDs to the display substrate, thus providing an increase in transfer process efficiency.

Furthermore, in the case where the inspecting step is performed at the transfer head, the micro LEDs are gripped on the lower surface of the transfer head and inspected through the inspecting step. This makes it possible to inspect the lower surfaces of the micro LEDs.

Furthermore, in the case where the removing step is performed at the transfer head, it is possible to remove a defective micro LED by simply detaching the defective micro LED. Thus, the removing step is performed quickly, leading to an increase in process efficiency in inspecting and replacing the micro LEDs.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Figure 1:
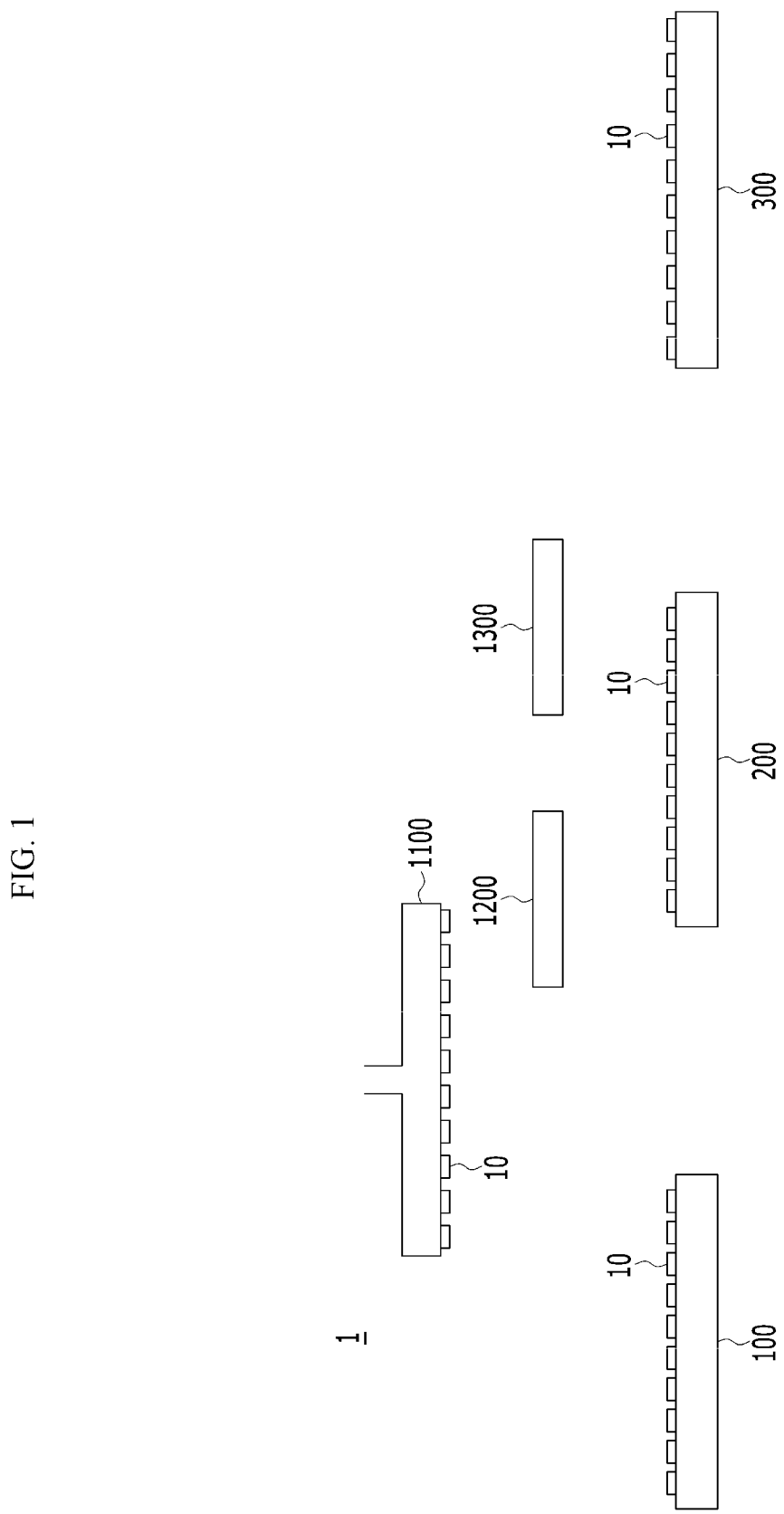
FIG. 1 is a view illustrating a system for inspecting and replacing a micro LED according to the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to such specifically listed exemplary embodiments and conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention.

For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

System 1 for Inspecting and Replacing a Micro LED

Hereinbelow, a system 1 for inspecting and replacing a micro LED according to the present invention will be described with reference to FIG. 1

FIG. 1 is a view schematically illustrating the system for inspecting and replacing the micro LED according to the present invention.

As shown in FIG. 1, the system 1 for inspecting and replacing the micro LED 1 according to the present invention includes:

a growth substrate 100 on which micro LEDs 10 are formed; a temporary substrate 200 on which the micro LEDs 10 are temporarily attached; a display substrate 300 on which the micro LEDs 10 are mounted; a transfer head 1100 for transferring the micro LEDs 10 to the growth substrate 100, the temporary substrate 200, and the display substrate 300; an inspection apparatus 1200 for inspecting whether the micro LEDs 10 are defective; and a replacement apparatus 1300 for attaching a normal micro LED 10 to at least one of the temporary substrate 200, the transfer head 1100, and the display substrate 300.

The growth substrate 100 may be formed into a conductive substrate or an insulating substrate. For example, the growth substrate 100 is formed of at least one selected from among the group consisting of sapphire, SiC, Si, GaAs, GaN, ZnO, GaP, InP, Ge, and $Ga_2O_3$.

The micro LED 10 is fabricated and disposed on the growth substrate 100. In other words, the fabricated micro LED 10 is formed on the growth substrate 100.

The micro LED 10 includes: a first semiconductor layer; a second semiconductor layer; an active layer provided between the first semiconductor layer and the second semiconductor layer; a first contact electrode; and a second contact electrode.

The first semiconductor layer, the active layer, and the second semiconductor layer may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer may be implemented, for example, as an n-type semiconductor layer. An n-type semiconductor layer may be a semiconductor material having a composition formula of $In_xAl_yGa_{1-x-y}N$ (0≤x≤1, 0≤y≤1, 0≤x+y≤1), for example, GaN, AlN, AlGaN, InGaN, InNIn-AlGaN, AlInN, and the like, and the layer may be doped with an n-type dopant such as Si, Ge, and Sn.

However, the present invention is not limited to this. The first semiconductor layer may include an n-type semiconductor layer, and the second semiconductor layer may include a p-type semiconductor layer.

The active layer is a region where electrons and holes are recombined. As the electrons and the holes are recombined, the active layer transits to a low energy level and generates light having a wavelength corresponding thereto. The active layer may be made of a semiconductor material having a composition formula of $In_xAl_yGa_{1-x-y}N$ (0≤x≤1, 0≤y≤1, 0≤x+y≤1) and may have a single quantum well structure or a multi quantum well (MQW) structure. In addition, the active layer may have a quantum wire structure or a quantum dot structure.

The first semiconductor layer may be provided with the first contact electrode, and the second semiconductor layer may be provided with the second contact electrode. The first contact electrode and/or the second contact electrode may include one or more layers and may be formed of various conductive materials including a metal, conductive oxide, and conductive polymer.

Multiple micro LEDs 10 formed on the growth substrate 100 are separated into individual pieces by cutting along a cutting line using a laser or the like or by etching. Then, it is possible to separate the individual micro LEDs 10 from the growth substrate 100 by a laser lift-off process.

The temporary substrate 200 is a substrate on which the micro LEDs 10 are temporarily attached.

The temporary substrate 200 may be formed into a conductive substrate or an insulating substrate. For example, the temporary substrate 200 is formed of at least one selected from among the group consisting of sapphire, SiC, Si, GaAs, GaN, ZnO, GaP, InP, Ge, and $Ga_2O_3$.

The micro LEDs 10 are attached to the temporary substrate 200 by a grip force. In this case, the grip force may be any one of an electrostatic force, a suction force, and a magnetic force.

The micro LEDs 10 attached to the temporary substrate 200 may be have the same arrangement as the micro LEDs 10 mounted on the display substrate 300. In other words, the interval between the micro LEDs 10 attached to the temporary substrate 200 may be the same as the interval between the micro LEDs 10 mounted on the display substrate 300. The interval between the micro LEDs 10 gripped on the transfer head 1100 that will be described later may be the same as the interval between the micro LEDs of the temporary substrate 200 and the display substrate 300.

As described above, because the interval between the micro LEDs 10 placed on the temporary substrate 200 and the display substrate 300 and the interval between the micro LEDs 10 gripped on transfer head 1100 all remain the same, when the transfer head 1100 picks up the micro LEDs 10 from the temporary substrate 200 and transfers the micro LEDs 10 to the display substrate 300, the micro LEDs 10 are easily mounted on the display substrate 300 without requiring a separate process.

The display substrate 300 is a substrate on which the micro LEDs 10 are mounted and processed for display.

The display substrate 300 may include various materials. For example, the display substrate 300 may be made of a transparent glass material having $SiO_2$ as a main component. However, materials of the display substrate 300 are not limited to this, and the display substrate 300 may be made of a transparent plastic material and thus have solubility. The plastic material may be an organic substance selected from among the group consisting of polyethersulfone (PES), polyacrylate (PAR), polyetherimide (PEI), polyethyelenen napthalate (PEN), polyethyeleneterepthalate (PET), polyphenylene sulfide (PPS), polyarylate, polyimide, polycarbonate (PC), cellulose triacetate (TAC), and cellulose acetate propionate (CAP) that are organic insulating substances.

In the case of a bottom emission type in which an image is implemented in a direction of the display substrate 300, the display substrate 300 is required to be formed of a transparent material. However, in the case of a top emission type in which an image is implemented in a direction opposite to the display substrate 300, the display substrate 300 is not required to be formed of a transparent material. In this case, the display substrate 300 may be formed of metal.

In the case of forming the display substrate 300 by using metal, the display substrate 300 may be formed of at least one metal selected from among the group consisting of iron, chromium, manganese, nickel, titanium, molybdenum, stainless steel (SUS), Invar, Inconel, and Kovar, but is not limited thereto.

The transfer head 1100 is provided movably between the growth substrate 100, the temporary substrate 200, and the display substrate 300 and functions to perform transfer of the micro LEDs from the growth substrate 100 to the temporary substrate 200, transfer of the micro LEDs 10 from the temporary substrate 200 to the display substrate 300, and transfer of the micro LEDs 10 from the growth substrate 100 to the display substrate 300.

The transfer head 1100 is provided on the lower surface thereof with multiple grip portions for gripping the micro LEDs 10.

The grip portions generate a grip force to grip the micro LEDs 10. In this case, the grip force may be any one of an electrostatic force, a suction force, and a magnetic force.

If the grip force of the grip portions is an electrostatic force, the grip portion may be made of a material which is easily charged. Thus, the electrostatic force is generated by electrification of the grip portions, and the micro LEDs 10 are gripped on the grip portions by the electrostatic force.

If the grip force of the grip portions is a magnetic force, a magnetic element may be provided in the grip portions. Thus, the micro LEDs 10 are gripped on the grip portions by the magnetic force of the magnetic element.

If the grip force of the grip portions is a suction force, each of the grip portions may be configured with pores and a suction chamber for providing a suction force to the pores. Thus, when gas is sucked through the suction chambers and the pores of the grip portions, the micro LEDs 10 are gripped on the grip portions by the suction force. In this case, the suction force may be a vacuum suction force.

The above-described multiple grip portions may be individually controllable. Thus, the transfer head 1100 grips only micro LEDs 10 at desired coordinates among the multiple micro LEDs 10, or detaches the micro LEDs 10 by releasing the grip force.

The multiple grip portions are the same in arrangement as the multiple micro LEDs 10 attached or mounted on the temporary substrate 200 or the display substrate 300 as described above. Thus, the transfer head 1100 picks up the micro LEDs 10 from the temporary substrate 200 and easily transfers the micro LEDs 10 to the display substrate 300.

An inspection apparatus 1200 functions to inspect whether the micro LEDs 10 are defective.

The inspection apparatus 1200 is movable over the growth substrate 100, over the temporary substrate 200, and over the display substrate 300, thus inspecting whether the micro LEDs 10 of the growth substrate 100, the micro LEDs 10 of the temporary substrate 200, and the micro LEDs 10 of the display substrate 300 are defective.

Furthermore, the inspection apparatus 1200 is movable under the transfer head 1100, thus inspecting whether the micro LEDs 10 gripped on the transfer head 1100 are defective.

A replacement apparatus 1300 functions to attach (or grip or mount) a normal micro LED to at least one of the temporary substrate 200, the transfer head 1100, and the display substrate 300 at a position where a defective micro LED 10, that is, an object to be replaced is located.

The replacement apparatus 1300 is provided to be movable over the temporary substrate 200, under the transfer head 1100, and over the display substrate 300.

Furthermore, the replacement apparatus 1300 is lowered toward an upper surface of the temporary substrate 200 and an upper surface of the display substrate 300.

Furthermore, the replacement apparatus 1300 is lifted toward a lower surface of the transfer head 1100.

The replacement apparatus 1300 is provided with a grip portion. The grip portion generates a grip force to grip the micro LEDs 10.

The grip portion grips the micro LEDs 10 by an electrostatic force, a magnetic force, and a suction force in the same manner as the grip portions of the transfer head 1100.

The replacement apparatus 1300 may include multiple grip portions, but includes one grip portion. This is because the yield of the micro LEDs 10 is 99.9%, and the number of the defective micro LEDs 10 is very small as compared with that of the normal micro LEDs 10.

Thus, the replacement apparatus 1300 performs a replacement process in a manner that the normal micro LED 10 is gripped on one grip portion, and the coordinates of the defective micro LED 10 that is an object to be replaced is received from the control unit to place the normal micro LED 10 to the coordinates.

Inspection and Replacement Method for a Micro LED 10 According to a First Embodiment of the Present Invention Hereinbelow, an inspection and replacement method for a micro LED 10 according to a first embodiment of the present invention using the system 1 for inspecting and replacing the micro LED described above will be described with reference to FIG. 2.

Figure 2:
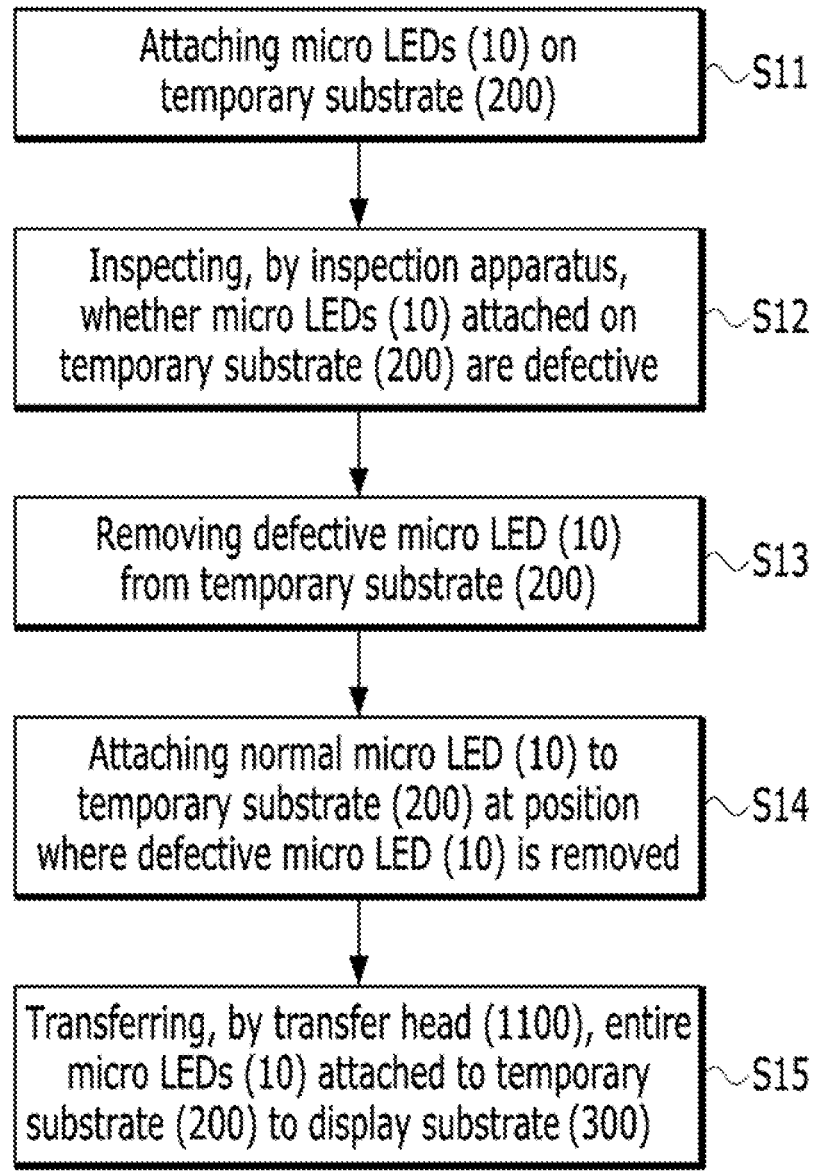
FIG. 2 is a flow chart schematically illustrating an inspection and replacement method for a micro LED according to a first embodiment of the present invention using the system for inspecting and replacing the micro LED of FIG. 1.

FIG. 2 is a flow chart schematically illustrating the inspection and replacement method for the micro LED according to the first embodiment of the present invention using the system 1 for inspecting and replacing the micro LED of FIG. 1.

As shown in FIG. 2, the inspection and replacement method for the micro LED 10 according to the first preferred embodiment of the present invention includes: an attaching step S11 of temporarily attaching micro LEDs 10 to a temporary substrate 200; an inspecting step S12 of inspecting, by an inspection apparatus 1200, whether the micro LEDs 10 attached to the temporary substrate 200 are defective; a removing step S13 of removing a defective micro LED 10 detected in the inspecting step S12 from the temporary substrate 200; a replacing step S14 of temporarily attaching, by a replacement apparatus 1300, a normal micro LED 10 to the temporary substrate 200 at a position where the defective micro LED 10 is removed; and a transferring step S15 of transferring, by a transfer head 1100, all the micro LEDs 10 temporarily attached to the temporary substrate 200 to a display substrate 300.

In the attaching step S11, a process of temporarily attaching the micro LEDs 10 to the temporary substrate 200 is performed.

First, to perform the attaching step S11, the transfer head 1100 is moved over a growth substrate 100, and then the transfer head 1100 is lowered, whereby the micro LED 10s formed on the growth substrate 100 are gripped and picked up by grip portions of the transfer head 1100. In this case, multiple micro LEDs 10 are gripped on the grip portions of the transfer head 1100.

Thereafter, the transfer head 1100 is moved over the temporary substrate 200 and lowered toward the temporary substrate 200, and the grip force of the grip portions is released, whereby the multiple micro LEDs 10 are placed on the upper surface of the temporary substrate 200.

The micro LEDs 10 placed on the temporary substrate 200 are temporarily attached to the temporary substrate 200, thus completing the attaching step S11.

After the attaching step S11 is completed, the inspecting step S12 is performed.

In the inspecting step S12, a process of inspecting, by the inspection apparatus 1200, whether the micro LEDs 10 attached to the temporary substrate 200 are defective is performed.

The inspection apparatus 1200 is moved over the temporary substrate 200 and then inspects whether the micro LEDs 10 temporarily attached to the upper surface of the temporary substrate 200 are defective.

The inspection apparatus 1200 inspects whether the micro LEDs 10 are defective by various methods. As an example, the inspection apparatus 1200 determines whether the micro LEDs 10 are defective by checking whether an electric current is applied to the micro LEDs 10 by using a probe needle or the like.

When the inspection apparatus 1200 detects a defective micro LED 10 among the micro LEDs 10 temporarily attached to the temporary substrate 200, a control unit connected to the inspection apparatus 1200 recognizes the coordinates of the defective micro LED 10.

As described above, when the inspection apparatus 1200 detects the defective micro LED 10 among the micro LEDs 10 attached to the temporary substrate 200, the inspecting step S12 is completed.

After the inspecting step S12 is completed, the removing step S13 is performed.

In the removing step S13, a process of removing the defective micro LED 10 detected in the inspecting step S12 from the temporary substrate 200 is performed.

To perform the removing step S13, the transfer head 1100 is moved over the temporary substrate 200 and then lowered.

The control unit transmits the coordinates of the defective micro LED 10 detected in the inspecting step S12 to the transfer head 1100 in the form of an electrical signal, and the grip portions of the transfer head 1100 grip and pick up only the defective micro LED 10 from the temporary substrate 200.

The picked up defective micro LED 10 is placed in a defective product collecting container or the like that collects only defective micro LEDs 10. Accordingly, the removal of the defective micro LED 10 from the temporary substrate 200 is completed, thus completing the removing step S13.

The removal of the defective micro LED 10 may be performed by the replacement apparatus 1300 or a separate removal apparatus, instead of the transfer head 1100. In this case, similarly to the transfer head 1100, the replacement apparatus 1300, or the removal apparatus is provided with an individually controllable grip portion for gripping only a defective micro LED 10.

After the removing step S13 is completed, the replacing step S14 is performed.

In the replacing step S14, a process of temporarily attaching the normal micro LED 10 by the replacement apparatus 1300 to the temporary substrate 200 at the position where the defective micro LED 10 is removed is performed.

The replacement apparatus 1300 grips the normal micro LED 10 and then is moved over the temporary substrate 200 and lowered.

In this case, the micro LED 10 is gripped on the lower surface of the replacement apparatus 1300. Thus, the grip portion of the replacement apparatus 1300 is provided on the lower surface of the replacement apparatus 1300, and the micro LED 10 is gripped on the grip portion of the replacement apparatus 1300 in a state in which the lower surface thereof is exposed.

The replacement apparatus 1300 receives the coordinates of the defective micro LED 10 from the control unit and places the normal micro LED 10 at the position where the defective micro LED 10 is removed, whereby the replacement apparatus 1300 temporarily attaches the normal micro LED 10 to the temporary substrate 200 at the position where the defective micro LED 10 is removed.

As described above, when the normal micro LED 10 is temporarily attached to the temporary substrate 200, the replacing step S14 is completed.

After the replacing step S14 is completed, the transferring step S15 is performed.

In the transferring step S15, a process of transferring, by the transfer head 1100, all the micro LEDs 10 temporarily attached to the temporary substrate 200 to the display substrate 300 is performed.

The transfer head 1100 is moved over the temporary substrate 200 and lowered and then allows the grip portions to grip and pick up all the micro LEDs 10 temporarily attached to the temporary substrate 200. In this case, the micro LEDs 10 picked up by the transfer head 1100 are all normal micro LEDs 10 because the replacing step S14 is performed above.

The transfer head 1100 is moved to the display substrate 300 after picking up the normal micro LEDs 10 and lowered and then releases the grip force of the grip portions to place the normal micro LEDs 10 on the upper surface of the display substrate 300, thus completing the transferring step S15.

The above-described transfer and replacement method for the micro LED 10 according to the first embodiment of the present invention ensures that only normal micro LEDs are transferred to the display substrate 300 through the removing step S13 and the replacing step S14. This makes it possible to effectively prevent the occurrence of defective pixels on a display, which may be caused by defective micro LEDs 10.

Furthermore, because the micro LEDs 10 are inspected for defects through the removing step S13 before being transferred to the display substrate 300, it is not necessary to perform a separate inspection at the display substrate 300. This makes it possible to provide an increase in transfer process efficiency.

Furthermore, because the replacing step S14 is performed at the temporary substrate 200, it is possible for the transfer head 1100 to simultaneously transfer the normal micro LEDs 10 to the display substrate 300, thus providing an increase in transfer process efficiency.

Inspection and Replacement Method for a Micro LED 10 According to a Second Embodiment of the Present Invention Hereinbelow, an inspection and replacement method for a micro LED 10 according to a second embodiment of the present invention using the system 1 for inspecting and replacing the micro LED described above will be described with reference to FIG. 3.

Figure 3:
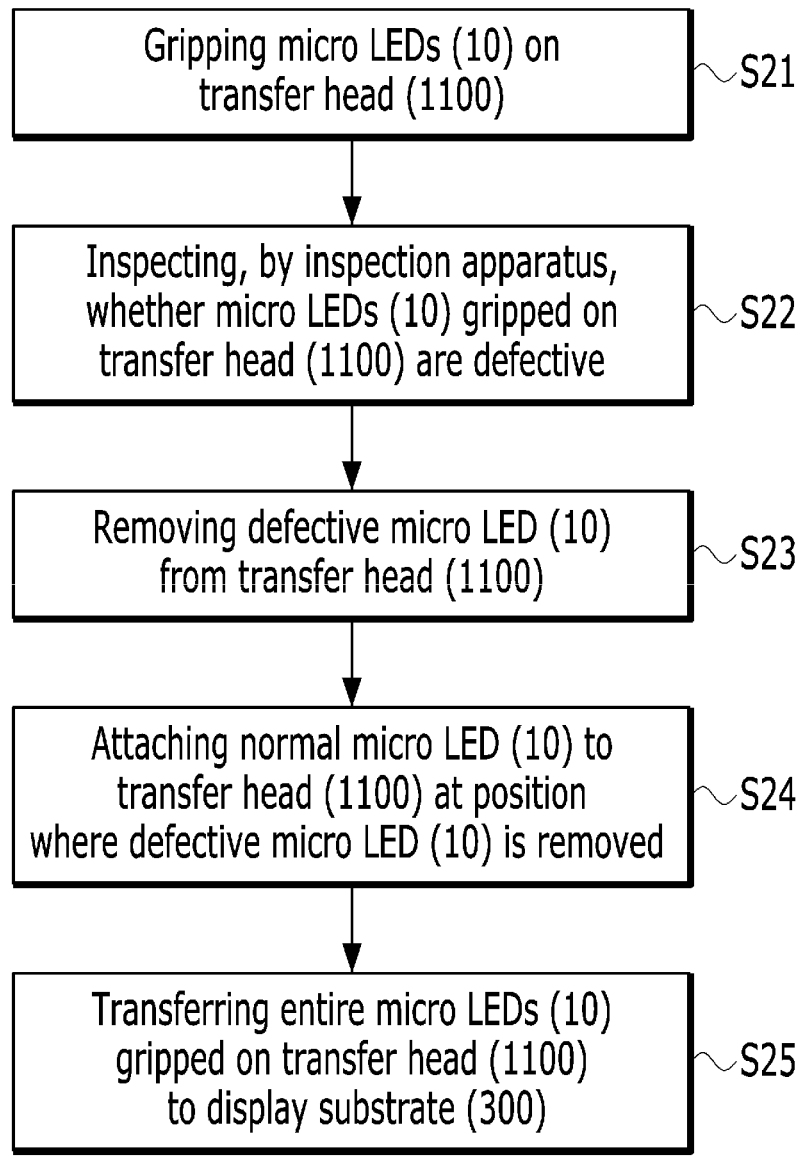
FIG. 3 is a flow chart schematically illustrating an inspection and replacement method for a micro LED according to a second embodiment of the present invention using the system for inspecting and replacing the micro LED of FIG. 1.

FIG. 3 is a flow chart schematically illustrating the inspection and replacement method for the micro LED according to the second embodiment of the present invention using the system 1 for inspecting and replacing the micro LED of FIG. 1.

As shown in FIG. 3, the inspection and replacement method for the micro LED 10 according to the second embodiment of the present invention includes: a gripping step S21 of gripping micro LEDs 10 on a transfer head; an inspecting step S22 of inspecting, by an inspection apparatus 1200, whether the micro LEDs 10 gripped on the transfer head 1100 are defective; a removing step S23 of removing a defective micro LED 10 detected in the inspecting step S22 from the transfer head 1100; a replacing step S24 of gripping a normal micro LED 10 by a replacement apparatus on the transfer head 1100 at a position where the defective micro LED 10 is removed; and a transferring step S25 of transferring all the micro LEDs 10 gripped on the transfer head 1100 to a display substrate 300.

In the gripping step S21, a process of gripping the micro LEDs 10 on the transfer head 1100 is performed.

As described above, the transfer head 1100 grips the micro LEDs 10 through grip portions.

The transfer head 1100 is moved over a growth substrate 100 and lowered and then grips and picks up the micro LEDs 10 formed on the growth substrate 100.

Alternatively, the transfer head 1100 is moved over a temporary substrate 200 and lowered and then grips and picks up the micro LEDs 10 that are transferred from the growth substrate 100 to the temporary substrate 200 and temporarily attached to the temporary substrate 200.

As described above, when multiple micro LEDs 10 are respectively gripped on multiple grip portions of the transfer head 1100, the gripping step S21 is completed.

After the gripping step S21 is completed, the inspecting step S22 is performed.

In the inspecting step S22, a process of inspecting by the inspection apparatus 1200 whether the micro LEDs 10 gripped on the transfer head 1100 are defective is performed.

First, when the inspection apparatus 1200 is moved over the transfer head 1100, or the transfer head 1100 is moved under the inspection apparatus 1200, the inspection apparatus 1200 inspects lower surfaces of the micro LEDs 10 gripped on the transfer head 1100 to inspect whether the micro LEDs 10 gripped on the transfer head 1100 are defective.

When the inspection apparatus 1200 detects a defective micro LED 10 among the micro LEDs 10 gripped on the transfer head 1100, a control unit connected to the inspection apparatus 1200 recognizes the coordinates of the defective micro LED 10.

As described above, when the inspection apparatus 1200 completes detecting the defective micro LED 10 among the micro LEDs 10 gripped on the transfer head 1100, the inspecting step S22 is completed.

After the inspecting step S22 is completed, the removing step S23 is performed.

In the removing step S23, a process of removing the defective micro LED 10 detected in the inspecting step S22 from the transfer head 1100 is performed.

First, the control unit transmits the coordinates of the defective micro LED 10 to the transfer head 1100.

The transfer head 1100 received the coordinates releases the grip force of a grip portion corresponding to the coordinates, whereby the defective micro LED 10 is detached and removed from the transfer head 1100.

In this case, the removal of the defective micro LED 10 is performed over a defective product collecting container. Thus, the defective micro LED 10 removed from the transfer head 1100 is easily collected by the defective product collecting container.

As described above, the removal of the defective micro LED 10 from the transfer head 1100 is completed, thus completing the removing step S23.

Unlike the above, the removal of the defective micro LED 10 from the transfer head 1100 may be performed by a separate removal apparatus. In this case, when the removal apparatus is moved under the transfer head 1100 and the detachment of the defective micro LED 10 is performed through the release of the grip force of the grip portion, the removal apparatus grips the detached defective micro LED 10, thus easily removing and collecting the defective micro LED 10.

After the removing step S23 is completed, the replacing step S24 is performed.

In the replacing step S24, a process of gripping the normal micro LED 10 by the replacement apparatus 1300 on the transfer head 1100 at the position where the defective micro LED 10 is removed is performed.

The transfer head 1100 is moved over the replacement apparatus 1300 with the gripped normal micro LED 10, or the replacement apparatus 1300 with the gripped normal micro LED 10 is moved under the transfer head 1100.

In this case, the micro LED 10 is gripped on the upper surface of the replacement apparatus 1300. Thus, a grip portion of the replacement apparatus 1300 is provided on the upper surface of the replacement apparatus 1300, and the micro LED 10 is gripped on the grip portion of the replacement apparatus 1300 in a state in which the upper surface thereof is exposed.

When the replacement apparatus 1300 is located under the transfer head 1100 and then lifted (or when the transfer head 1100 is lowered), the replacement apparatus 1300 receives the coordinates of the defective micro LED 10 from the control unit and releases the gripped normal micro LED 10 corresponding to the position where the defective micro LED 10 is removed.

Thereafter, the grip portion of the transfer head 1100 that corresponds to the position where the defective micro LED 10 is removed generates the grip force, thus gripping the normal micro LED 10.

As described above, when the normal micro LED 10 is gripped on the transfer head 1100 at the position where the defective micro LED 10 is removed, the replacing step S24 is completed.

After the replacing step S24 is completed, the transferring step S25 is performed.

In the transferring step S25, a process of transferring all the micro LEDs 10 gripped on the transfer head 1100 to the display substrate 300 is performed.

To transfer the micro LEDs 10 to the display substrate 300, the transfer head 1100 is moved over the display substrate 300 and then lowered. In this case, the micro LEDs 10 gripped on the transfer head 1100 are all normal micro LEDs 10 because the replacing step S24 is performed above.

The transfer head 1100 releases the grip force of the grip portions to place the normal micro LEDs 10 on the upper surface of the display substrate 300, thus completing the transferring step S25.

In the above-described transfer and replacement method for the micro LED 10 according to the second embodiment of the present invention, the micro LEDs 10 are gripped on the lower surface of the transfer head 1100 and inspected through the inspecting step S22. This makes it possible to inspect the lower surfaces of the micro LEDs 10.

Furthermore, the removing step S23 is performed at the transfer head 1100, making it possible to remove a defective micro LED 10 by simply detaching the defective micro LED 10. Thus, the removing step S23 is performed quickly, leading to an increase in process efficiency in inspecting and replacing the micro LEDs 10.

Inspection and Replacement Method for a Micro LED 10 According to a Third Embodiment of the Present Invention Hereinbelow, an inspection and replacement method for a micro LED 10 according to a third embodiment of the present invention using the system 1 for inspecting and replacing the micro LED described above will be described with reference to FIG. 4.

Figure 4:
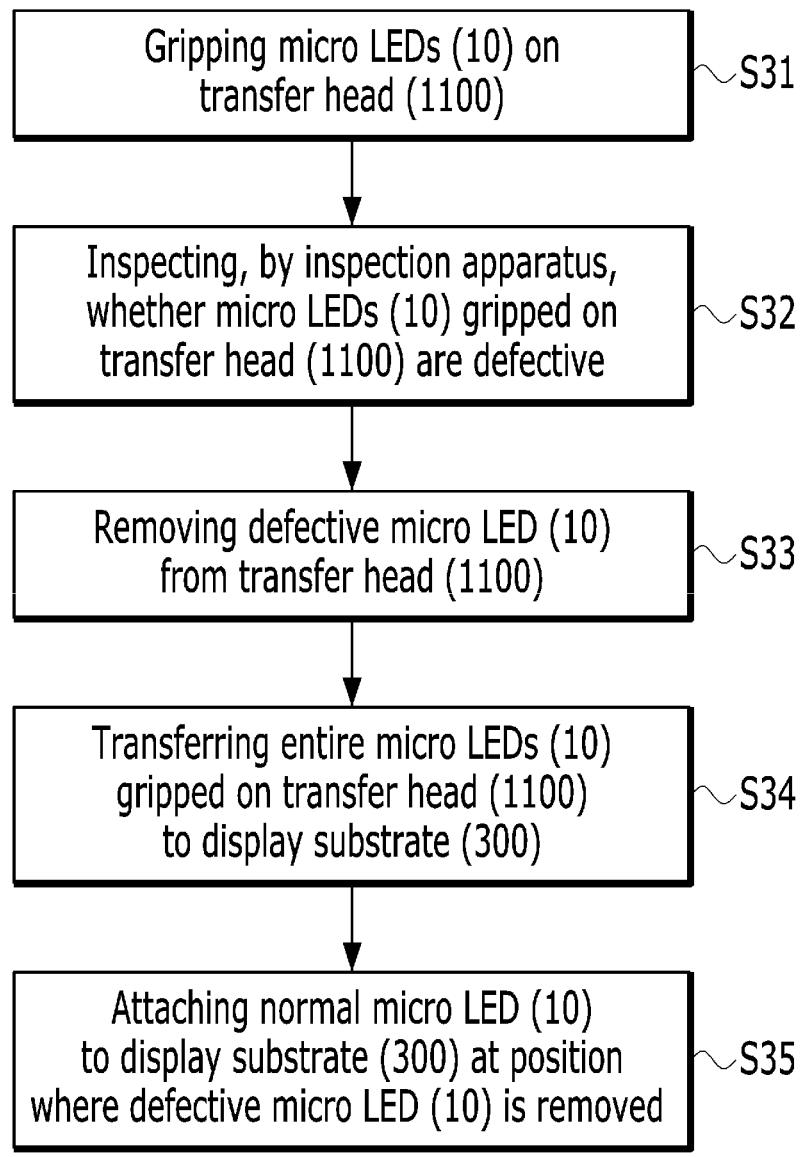
FIG. 4 is a flow chart schematically illustrating an inspection and replacement method for a micro LED according to a third embodiment of the present invention using the system for inspecting and replacing the micro LED of FIG. 1.

FIG. 4 is a flow chart schematically illustrating the inspection and replacement method for the micro LED according to the third embodiment of the present invention using the system 1 for inspecting and replacing the micro LED of FIG. 1.

As shown in FIG. 4, the inspection and replacement method for the micro LED 10 according to the third embodiment of the present invention includes: a gripping step S31 of gripping micro LEDs 10 on a transfer head 1100; an inspecting step S32 of inspecting, by an inspection apparatus 1200, whether the micro LEDs 10 gripped on the transfer head 1100 are defective; a removing step S33 of removing a defective micro LED 10 detected in the inspecting step S32 from the transfer head 1100; a transferring step S34 of transferring all the micro LEDs 10 gripped on the transfer head 1100 to a display substrate 300; and a replacing step S35 of attaching, by a replacement apparatus 1300, a normal micro LED 10 to the display substrate 300 at a position where the defective micro LED 10 is removed.

The inspection and replacement method for the micro LED 10 according to the third embodiment of the present invention differs from the above-described transfer and replacement method for the micro LED 10 according to the second embodiment of the present invention in that the transferring step S34 is performed after the removing step S33, and then the replacing step S35 is performed.

In other words, the inspection of the micro LEDs and the removal of the defective micro LED 10 are performed at the transfer head 1100, and the replacement is performed at the display substrate 300.

Accordingly, the description of the gripping step S31, the inspecting step S32, and the removing step S33 remains the same as that of the above-described transfer and replacement method for the micro LED 10 according to the second embodiment of the present invention, and thus a repetitive description thereof will be omitted.

The transferring step S34 is performed after the defective micro LED 10 is removed from the transfer head 1100 in the removing step S33.

In the transferring step S34, a process of transferring all the micro LEDs 10 gripped on the transfer head 1100 to the display substrate 300 is performed.

The transfer head 1100 is moved over the display substrate 300 and lowered, and the grip force of grip portions is released, whereby all the micro LEDs 10 gripped on the transfer head 1100 are placed on the display substrate 300.

As described above, when all the micro LEDs 10 are transferred from the transfer head 1100 and placed on the display substrate 300, the transferring step S34 is completed.

After the transferring step S34 is completed, the replacing step S35 is performed.

In the replacing step S35, a process of attaching by the replacement apparatus 1300 the normal micro LED 10 to the display substrate 300 at the position where the defective micro LED 10 is removed is performed.

The replacement apparatus 1300 grips the normal micro LED 10 and then is moved over the display substrate 300 and lowered.

In this case, the micro LED 10 is gripped on the lower surface of the replacement apparatus 1300. Thus, a grip portion of the replacement apparatus 1300 is provided on the lower surface of the replacement apparatus 1300, and the micro LED 10 is gripped on the grip portion of the replacement apparatus 1300 in a state in which the lower surface thereof is exposed.

The replacement apparatus 1300 receives the coordinates of a defective micro LED 10 from a control unit.

In this case, the coordinates of the defective micro LED 10 are the coordinates of the defective micro LED 10 gripped on the transfer head 1100 and detected by the inspection apparatus 1200, and which correspond to the coordinates of the display substrate 300.

The replacement apparatus 1300 places the normal micro LED 10 in response to the coordinate information at the position where the defective micro LED 10 is removed, whereby the replacement apparatus 1300 attaches the normal micro LED 10 to the display substrate 300 at the position where the defective micro LED 10 is removed.

As described above, when the normal micro LED 10 is attached (or placed) to the display substrate 300, the replacing step S35 is completed.

In the above-described transfer and replacement method for the micro LED 10 according to the third embodiment of the present invention, the replacing step 35 is performed at the display substrate 300, making it possible to prevent the defective micro LED 10 from occurring at the display substrate 300.

Inspection and Replacement Method for a Micro LED 10 According to a Fourth Embodiment of the Present Invention Hereinbelow, an inspection and replacement method for a micro LED 10 according to a fourth embodiment of the present invention using the system 1 for inspecting and replacing the micro LED described above will be described with reference to FIG. 5.

Figure 5:
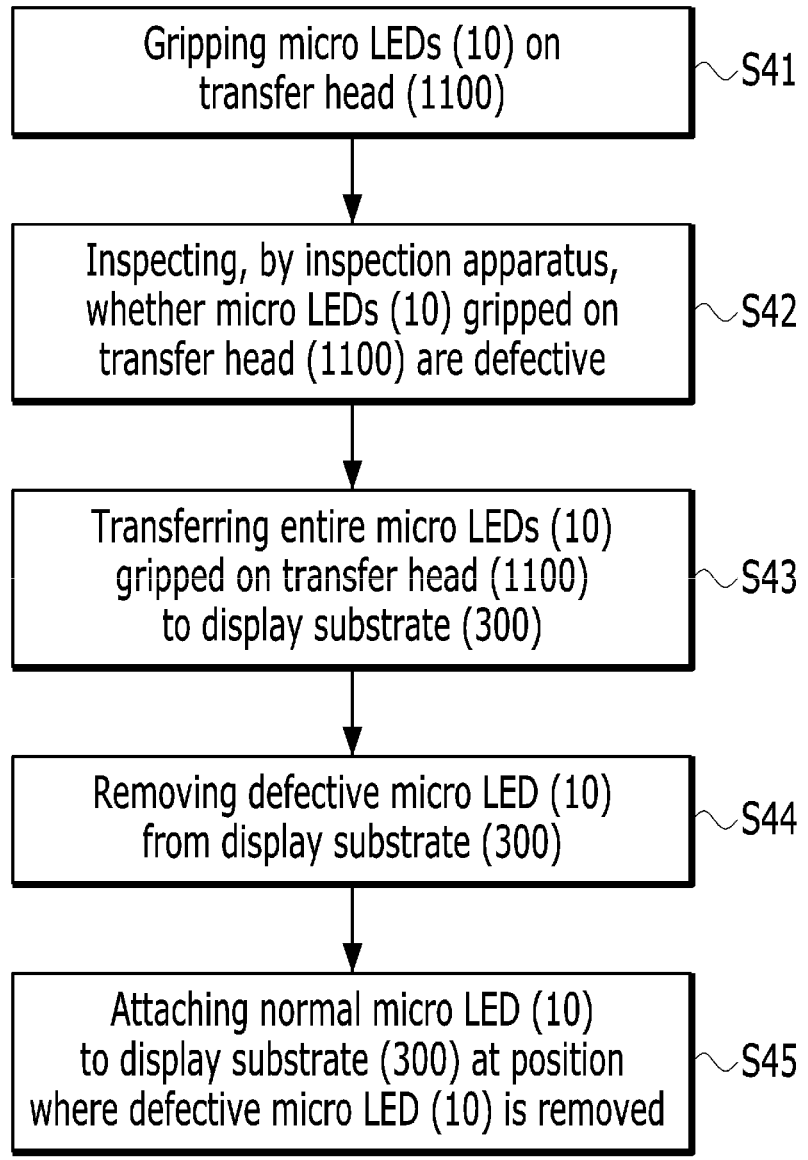
FIG. 5 is a flow chart schematically illustrating an inspection and replacement method for a micro LED according to a fourth embodiment of the present invention using the system for inspecting and replacing the micro LED of FIG. 1.

FIG. 5 is a flow chart schematically illustrating the inspection and replacement method for the micro LED according to the fourth embodiment of the present invention using the system 1 for inspecting and replacing the micro LED of FIG. 1.

As shown in FIG. 5, the inspection and replacement method for the micro LED 10 according to the fourth embodiment of the present invention includes: a gripping step S41 of gripping micro LEDs 10 on a transfer head 1100; an inspecting step S42 of inspecting, by an inspection apparatus 1200, whether the micro LEDs 10 gripped on the transfer head 1100 are defective; a transferring step S43 of transferring all the micro LEDs 10 gripped on the transfer head 1100 to a display substrate 300; a removing step S44 of removing a defective micro LED 10 detected in the inspecting step S42 from the display substrate 300; and a replacing step S45 of attaching, by a replacement apparatus 1300, a normal micro LED 10 to the display substrate 300 at a position where the defective micro LED 10 is removed.

The inspection and replacement method for the micro LED 10 according to the fourth embodiment of the present invention differs from the above-described transfer and replacement method for the micro LED 10 according to the second embodiment of the present invention in that the transferring step S43 is performed after the inspecting step S42, and then the removing step 44 and the replacing step S45 are performed.

In other words, the inspection of the micro LED is performed at the transfer head 1100, and the removal and replacement of the defective micro LED are performed at the display substrate 300.

Accordingly, the description of the gripping step S41 and the inspecting step S42 remains the same as that of the above-described transfer and replacement method for the micro LED 10 according to the second embodiment of the present invention, and thus a repetitive description thereof will be omitted.

In the transferring step S34, a process of transferring all the micro LEDs 10 gripped on the transfer head 1100 to the display substrate 300 is performed.

In this case, normal micro LEDs 10 and defective micro LEDs 10 are gripped on grip portions of the transfer head 1100 in a mixed arrangement.

The transfer head 1100 is moved over the display substrate 300 and lowered, and the grip force of the grip portions is released, whereby all the micro LEDs 10 gripped on the transfer head 1100 are placed on the display substrate 300.

As described above, when all the micro LEDs 10 are transferred from the transfer head 1100 and placed on the display substrate 300, the transferring step S43 is completed.

After the transferring step S43 is completed, the removing step S44 is performed.

In the removing step S44, a process of removing the defective micro LED 10 detected in the inspecting step S42 from the display substrate 300 is performed.

To perform the removing step S44, the transfer head 1100 is moved over the display substrate 300 and then lowered.

The control unit transmits the coordinates of the defective micro LED 10 detected in the inspecting step S42 to the transfer head 1100 in the form of an electrical signal, and the grip portions of the transfer head 1100 grip and pick up only the defective micro LED 10 from the display substrate 300.

The picked up defective micro LED 10 is placed in a defective product collecting container or the like that collects only defective micro LEDs 10. Accordingly, the removal of the defective micro LED 10 from the display substrate 300 is completed, thus completing the removing step S44.

The removal of the defective micro LED 10 may be performed by the replacement apparatus 1300 or a separate removal apparatus, instead of the transfer head 1100. In this case, similarly to the transfer head 1100, the replacement apparatus 1300, or the removal apparatus is provided with an individually controllable grip portion for gripping only a defective micro LED 10.

After the removing step S44 is completed, the replacing step S45 is performed.

In the replacing step S45, a process of attaching the normal micro LED 10 by the replacement apparatus 1300 to the display substrate 300 at the position where the defective micro LED 10 is removed is performed.

The replacement apparatus 1300 grips the normal micro LED 10 and then is moved over the display substrate 300 and lowered.

In this case, the micro LED 10 is gripped on the lower surface of the replacement apparatus 1300. Thus, a grip portion of the replacement apparatus 1300 is provided on the lower surface of the replacement apparatus 1300, and the micro LED 10 is gripped on the grip portion of the replacement apparatus 1300 in a state in which the lower surface thereof is exposed.

The replacement apparatus 1300 receives the coordinates of a defective micro LED 10 from the control unit.

In this case, the coordinates of the defective micro LED 10 are the coordinates of the defective micro LED 10 attached to the display substrate 300 (or placed) and detected by the inspection apparatus 1200.

The replacement apparatus 1300 places the normal micro LED 10 in response to the coordinate information at the position where the defective micro LED 10 is removed, whereby the replacement apparatus 1300 attaches the normal micro LED 10 to the display substrate 300 at the position where the defective micro LED 10 is removed.

As described above, when the normal micro LED 10 is attached (or placed) to the display substrate 300, the replacing step S45 is completed.

In the above-described transfer and replacement method for the micro LED 10 according to the fourth embodiment of the present invention, the removing step 44 and the replacing step 45 are performed at the display substrate 300, making it possible to prevent the defective micro LED 10 from occurring at the display substrate 300.

Although the exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An inspection and replacement method for a micro LED, the method comprising:
   gripping micro LEDs on a transfer head;
   inspecting whether the micro LEDs gripped on the transfer head are defective;
   removing a defective micro LED, which is detected in the inspection process, from the transfer head;
   gripping a functional micro LED on the transfer head at a position where the defective micro LED is removed; and
   transferring all the micro LEDs gripped on the transfer head to a display substrate.

2. An inspection and replacement method for a micro LED, the method comprising:
   gripping micro LEDs on a transfer head;
   inspecting whether the micro LEDs gripped on the transfer head are defective;
   removing a defective micro LED, which is detected in the inspection process, from the transfer head;
   transferring all the micro LEDs gripped on the transfer head to a display substrate; and
   attaching a functional micro LED to the display substrate at a position where the defective micro LED is removed.

3. An inspection and replacement method for a micro LED, the method comprising:
   gripping micro LEDs on a transfer head;
   inspecting whether the micro LEDs gripped on the transfer head are defective;
   transferring all the micro LEDs gripped on the transfer head to a display substrate;
   removing a defective micro LED, which is detected in the inspection process, from the display substrate; and
   attaching a functional micro LED to the display substrate at a position where the defective micro LED is removed.

* * * * *